(12) United States Patent
Gotkis et al.

(10) Patent No.: US 7,528,349 B1
(45) Date of Patent: May 5, 2009

(54) TEMPERATURE STABILIZATION FOR SUBSTRATE PROCESSING

(75) Inventors: Yehiel Gotkis, Fremont, CA (US); Arik Donde, Cupertino, CA (US); Vincenzo Lordi, Livermore, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 206 days.

(21) Appl. No.: 11/532,748

(22) Filed: Sep. 18, 2006

Related U.S. Application Data

(60) Provisional application No. 60/820,324, filed on Jul. 25, 2006.

(51) Int. Cl.
*H05B 3/68* (2006.01)
*F26B 19/00* (2006.01)

(52) U.S. Cl. .................. 219/444.1; 219/390; 219/405; 219/411; 219/443.1; 392/416; 392/418; 118/724; 118/725; 118/50.1

(58) Field of Classification Search .............. 219/390, 219/405, 411, 444.1, 443.1; 392/416, 418; 118/724, 725, 50.1
See application file for complete search history.

(56) References Cited

U.S. PATENT DOCUMENTS

| 4,514,250 A * | 4/1985 | Hwang ..................... 117/106 |
| 6,552,773 B2 | 4/2003 | Emoto ...................... 355/53 |
| 7,106,416 B2 * | 9/2006 | Box et al. ................. 355/53 |
| 2005/0092013 A1 | 5/2005 | Emoto ...................... 62/304 |

OTHER PUBLICATIONS

U.S. Appl. No. 11/670,896 to Marek Zywno and Noah Bareket, filed Feb. 2, 2007.

* cited by examiner

*Primary Examiner*—Shawntina Fuqua
(74) *Attorney, Agent, or Firm*—Joshua D. Isenberg; JDI Patent

(57) ABSTRACT

A temperature stabilization system, method, composition of matter and substrate processing system are disclosed. A heat absorbing material is disposed in thermal contact with a substrate. The heat absorbing material is characterized by a solid-liquid phase transition temperature that is in a desired temperature range for material processing the substrate. When the substrate is subjected to material processing that results in heat transfer into or out of the substrate the solid-liquid phase transition of the heat absorbing material stabilizes the temperature of the substrate.

21 Claims, 2 Drawing Sheets

TEMPERATURE STABILIZATION FOR SUBSTRATE PROCESSING

CROSS-REFERENCE TO A RELATED APPLICATION

This application claims priority from provisional patent application Ser. No. 60/820,324, which was filed on Jul. 25, 2006, the entire disclosures of which are incorporated herein by reference.

FIELD OF THE INVENTION

Embodiments of the direction are directed to substrate processing. More particularly, embodiments of the invention are directed to temperature stabilization based on heat flow auto-management utilizing a solid-liquid (or solid-solid) phase transition of a material.

BACKGROUND OF THE INVENTION

In various fabrication processes used in semiconductor industry, a substrate such as a semiconductor wafer may be exposed to various types of the energetic treatments (plasma, energetic particles, light irradiation etc.). An example of such a process is known as electron beam (e-beam) lithography. Electron beam lithography has been used, e.g., for writing patterns, such as electrical circuit patterns, on substrates used as masks for more conventional photolithography. In such a process, a suitably prepared surface of the substrate is supported on a horizontal moveable stage (sometimes called a stepper) and exposed to a focused e-beam, in particular a writing spot or probe of the beam.

While e-beam lithography can be used in industry for direct writing of integrated circuit features on a semiconductor wafer, the process is used mainly to generate exposure masks to be used with conventional photolithography. E-beam direct writing may also be used in applications for which it is more cost-effective to avoid the use of masks, e.g., low volume production or prototyping. In conventional direct electron beam (e-beam) writing, an intense beam of electrons from a fixed source is focused onto a point on a resist on the surface of the wafer. A stepper translates the wafer relative to the electron beam as the beam is turned on and off to produce a pattern of exposure of the resist. Due to limitations on the steppers used to translate the wafer, e-beam lithography processes in their existing configurations are too slow for economical direct writing of integrated circuit patterns on a wafer. Consequently, e-beam lithography has not been used for large volume semiconductor processing. Chip production using conventional photolithography can typically produce about 1 wafer per minute. Manufacturing the same wafer using e-beam lithography processes is expected to take 5-10 hours per wafer using conventional steppers. Thus, the production rate for e-beam lithography would have to improve by factor of about 500 in order to be competitive with conventional photolithography.

Ways to improve the speed of writing patterns on the wafer are normally associated with switching from single point writing to a parallel, multi-beam or wide beam, writing strategy. In such cases, the direct writing is associated with fast movement of the wafer relative to the position of the writing e-beam. The requirement of fast mechanical translation combined with extremely tough positioning precision requirements (e.g., 5 nm or better for the advanced states of technology) does not allow for significant physical contacts between the moving wafer stage and external objects. This imposes significant limitations in providing thermal flow management and wafer temperature stabilization.

To provide the required throughput the e-beam has to bring to the wafer about 1 Watt of energy that may cause the local wafer temperature to increase by up to 10° C. This temperature increase is usually distributed non-uniformly across the surface of the wafer. This non-uniform variation in wafer temperature distorts the wafer, introducing errors in the position of the electron beam relative to the actual wafer coordinates. For small design rules (e.g., 65 nanometers or less), such thermally induced errors can critically affect the applicability of the e-beam direct write technique. It is estimated that a wafer temperature change of about 0.001° C. can correspond an uncertainty of roughly 1 nanometer (nm) in the position of the electron beam with respect to the actual wafer surface coordinates. Consequently, a good thermal management system is required to keep the wafer at a given temperature or within a safe temperature interval. However, conventional approaches to thermal management (e.g., backside gas conduction, liquid or gas convection, liquid evaporation, etc.) are not compatible with the direct e-beam writing process conditions, e.g. high vacuum, fast, vibration-less motion, no physical contacts with the external objects for heat transfer to or from the wafer during processing.

For example, US Patent Application Publication Number 2001/0001248A1 teaches a temperature adjusting mechanism collecting heat from a driving mechanism, wherein the amount of cooling implemented by a temperature adjusting mechanism is controlled on the basis of a signal applied from a drive controlling device to the driving mechanism. However, the design of the temperature adjusting mechanism in this prior art is complicated, and particularly unsuitable for a fast moving system due to vibrations generated by the electrical wiring.

US Patent Application Publication Number 2005/0092013 A1 teaches a cooling mechanism based on vaporization of a liquid. However, this cooling mechanism requires a complicated exhausted unit, which is not suitable for performing e-beam lithography under ultra-high vacuum conditions and on a rapidly moving wafer.

Thus, there is a need in the art, for thermal management and temperature stabilization concept and a method for stabilizing the temperature of fast moving objects under ultra-high vacuum conditions that overcomes the above drawbacks.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, embodiments of the invention as described below are set forth without any loss of generality to, and without imposing limitations upon, the claimed invention.

Figure 1A:
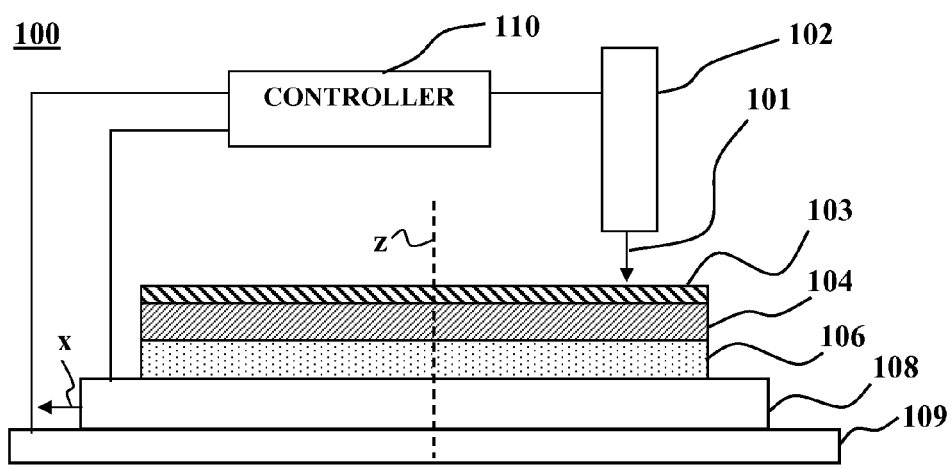
FIG. 1A is a cross-sectional schematic diagram of a substrate processing system employing phase-transition driven temperature stabilization according to an embodiment of the present invention.

FIG. 1A is a cross sectional view of a temperature stabilization system according to a preferred embodiment of the present invention. As shown in FIG. 1A, system 100 includes a susceptor 108 and a heat absorbing material 106 disposed between the susceptor 108 and one or more substrates 104. The heat absorbing material 106 includes a component that undergoes solid-liquid (melting) or solid-solid (structural) phase transformation at a desired operating temperature for material processing of the substrate 104. Preferably, the heat absorbing material 106 has a phase transition temperature at about room temperature and also has an extremely low partial vapor pressure at room temperature. By way of example, the heat absorbing material 106 may be a low melting point metal, such as Gallium (Ga). If different system temperatures are required, Indium (In), Tin (Sn) or Lead (Pb) metals and/or alloys of two or more metals such as Ga, In, Sn, and Pb, or some suitable inorganic or organic substances that melt without decomposition at a constant temperature may also be used.

Figure 1B:
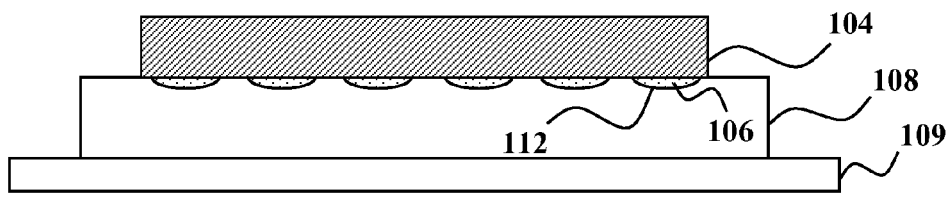
FIG. 1B is a cross-sectional schematic diagram of an alternative implementation of phase-transition driven temperature stabilization according to an embodiment of the present invention.
Figure 1C:
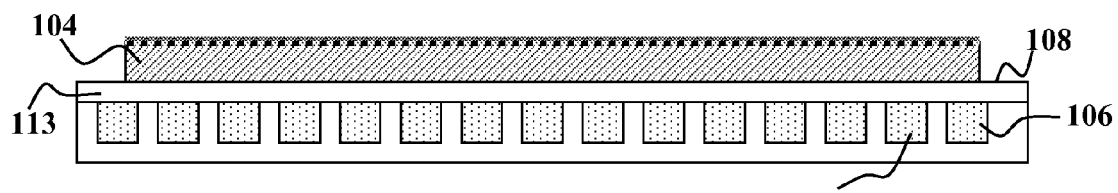
FIG. 1C is a cross-sectional schematic diagram of another alternative implementation of phase-transition driven temperature stabilization according to an embodiment of the present invention.

Although in FIG. 1A the heat absorbing material 106 is shown as being a flat layer disposed on top of the susceptor 108, embodiments of the present invention are not limited by such configurations. For example, as shown in FIG. 1B, the heat absorbing material 106 may be disposed in one or more depressions 112 in the surface of the susceptor 108. In addition, as depicted in FIG. 1C, the heat absorbing material 106 may be embedded in susceptor 108, e.g., by filling the recesses 112 with the heat absorbing material 106 and then covering the recesses with a suitable thermally conducting layer 113 that is in sufficient thermal contact with both the substrate 104 and the heat absorbing material 106.

The system 100 may further include an electron beam source 102, which may be used for performing electron beam lithography on the substrate 104. The electron beam source 102 may be fixed in position and orientation relative to the susceptor 108. The electron beam source 102 directs a focused beam of electrons 101 onto a point on the surface of the substrate. The substrate may be coated with a resist 103 that, upon interaction with the electron beam 101 becomes susceptible to or resistant to removal by a solvent in subsequent development process. To facilitate patterning of the resist 103 by the electron beam 101, the susceptor 108 may include a motor and/or bearings to facilitate translational motion of the substrate 104 along an axis x that is more or less parallel top a plane of the substrate 104. The susceptor 108 may be mounted to a translating mechanism 109 that can translate the susceptor 108 along an axis y that is more or less perpendicular to the axis x and more or less parallel top a plane of the substrate 104. The electron beam source 102, susceptor 108 and translating mechanism 109 may operate under signals from a controller 110. The controller 110 may direct the electron beam source 102 to selectively adjust an electron beam current (e.g., by turning the electron beam 101 on and off) as the susceptor 108 translates so that electron beam direct write lithography may be performed along a predetermined path on the substrate 104.

To facilitate direct write lithography along an arbitrary predetermined path, the susceptor 108 may be mounted to a translating mechanism 109 that can translate the susceptor 108 along the x-axis or y-axis. The electron beam source 102, susceptor 108 and translating mechanism 109 may operate under signals from a controller 110. The controller 110 may direct the electron beam source 102 to selectively adjust an electron beam current (e.g., by turning the electron beam 101 on and off) as the susceptor 108 translates the substrate 104 so that electron beam lithography may be performed along the predetermined path on the substrate 104. There are numerous possible shapes for the predetermined path. For example, the path may combine a reciprocating along the x-axis with a translating motion along the y-axis to produce a zigzag pattern similar to a raster pattern used in a television or computer monitor screen.

In some embodiments, the susceptor 108 may include a motor and/or bearings to facilitate spinning of the substrate 104 about an axis z that is more or less perpendicular to both the x-axis and the y-axis. By combining spinning of the substrate about the z-axis with translation of the substrate along the x and/or y axis, electron beam lithography may be performed along a spiral or other similarly-shaped path. Other arbitrary scanning patterns are within the scope of embodiments of the present invention. For example, two or more substrates may be mounted to the susceptor 108 and processed by the electron beam 101 using a predetermined path that intersects the two or more substrates.

Figure 2:
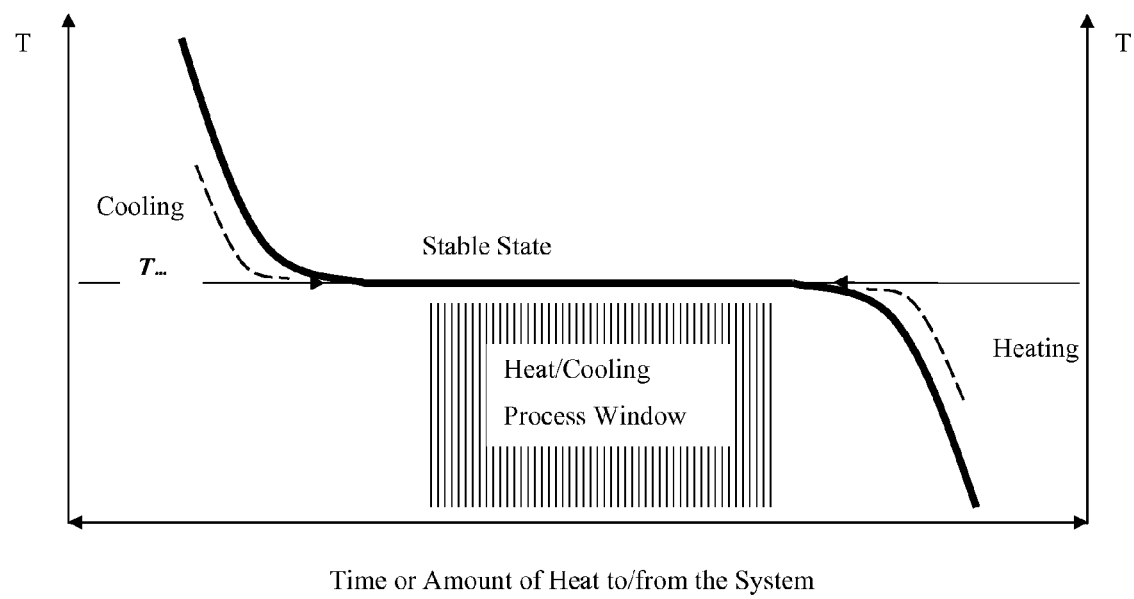
FIG. 2 is a temperature diagram of a system based on the fundamental Gibbs phase rule and associated heat absorption at a constant temperature during a phase transition.

As described above, in the absence of some thermal stabilization system, heating of the substrate 104 due to electron beam lithography, e.g., about 1 watt might otherwise increase the temperature of the substrate 104 depending on its composition and structure by up to 10° C. Melting of the heat absorbing material 106 can absorb this heat, which will keep the temperature of the substrate 104 constant. Such phase-transition driven thermal stabilization may be understood with reference to FIG. 2, which depicts a temperature diagram of a pure single component material based on the fundamental Gibbs phase rule and associated heat absorption at a constant temperature during a phase transition. As used herein, the term "pure material" refers to a material that is characterized by a well-defined transition temperature $T_m$ for transitions between the solid and liquid phases and vice versa. Pure materials are distinguished from multi-component materials for which the phase transition may occur over a range of temperatures. Normally, the heat flowing to or from a pure material system in a single phase (e.g., solid, liquid or vapor) is distributed amongst the material's various degrees of freedom. These degrees of freedom are associated with the internal channels the energy could be deposited within the bulk of the material. Thus, when heat flows into the system, the system temperature tends to rise. When heat is removed from the system its temperature tends to fall. At a phase transition, e.g., between the solid and molten (liquid) states, the behavior of the system temperature with addition or removal of heat tends to be different.

According to the Gibbs rule, the number of thermodynamic degrees of freedom f for a single component system (c=1) at phase transition (p=2) temperature $T_m$ is equal to zero (f=c−p+1, c=1−2+1=0). This means that when a single component partially molten system at the phase transition temperature $T_m$ is heated, more of its solid phase melts and the heat flowing into the system is absorbed by the solid-to-liquid phase transformation. As a result, the temperature of the system (liquid plus solid phases of the material) remains constant until all solid phase material is converted into the molten (liquid) phase. Similarly, if a single component partially molten system at the melting temperature is cooled down the molten material will start to crystallize, releasing the heat needed to sustain the system temperature equal to $T_m$. Heat released by the crystallization compensates for the heat lost by the system keeping the system at a constant temperature until all molten material is solidified.

This concept allows two thermal management tasks to be accomplished simultaneously. First, the system may be cooled down (or heated up) only by internal means, i.e. utilizing the phase transition to balance thermal energy flow into or out of the substrate 104. In addition, the temperature of the substrate 104 may be stabilized without having to use additional supporting electrical, mechanical or other types of temperature stabilization devices during processing of the substrate 104. Specifically, phase-transition drive temperature regulation may be implemented without having to provide any external heat transfer channel, e.g., by conduction, convection or radiation. Specifically, phase-transition driven temperature stabilization may be implemented during processing without having to employ complicated cooling channels for heat transfer by gas or liquid convection, backside gas for conduction, or thermoelectric effect. Such heat transfer mechanisms may be particularly difficult and expensive to implement, e.g., where the susceptor 108 is moving at high speed. The heat transfer material 106 and/or susceptor 108 and/or substrate 104 may be cooled down or warmed up to a desired temperature for processing, e.g., the melting temperature $T_m$, before processing the substrate 104. Such pre-process cooling or heating may be implemented by placing the substrate 104 and/or heat transfer material 106 and/or susceptor 108 in thermal contact with heat sink having the desired temperature and allowing them to come to thermal equilibrium.

The choice of heat absorbing material 106 is partly dependent on the desired temperature for processing the substrate 104. In many semiconductor industry applications it is desirable to maintain the temperature of a substrate, e.g., a semiconductor wafer, substantially constant and close to an ambient temperature, e.g., room temperature during material processes. As used herein, material processing and material processes refer to processing and processes that involve more than mere temperature regulation of the substrate 104. In the particular material processes involve exposing the substrate to energetic particles or electromagnetic radiation during some form of modification, fabrication of structures on, or analysis or inspection of the substrate 104. Examples of such material processes include, but are not limited to, scanning electron microscopy (SEM), optical or electron beam lithography and wafer inspection. In such cases, as described above, the heat absorbing material 106 may contain Gallium metal, which has melting point of about 29.8° C. This temperature is quite close to room temperature. As such, Gallium metal is a suitable heat transfer material for maintaining a substrate at an ambient temperature of about room temperature.

Preferably, the amount of Gallium used in the heat absorbing material 106 is sufficient to cope with the amount of energy (and associated heat) absorbed by the substrate 104 during processing cycle of the substrate, e.g., during electron beam lithography. The amount of heat to be absorbed by the substrate 104 may be calculated from the known thermodynamic data on the melting enthalpy $\Delta H_m$. Specifically, if the rate of incoming energy (heat) flux q (e.g., in Watts) and the duration of processing t (e.g., in seconds) are known and the value of $\Delta H_m$ is known for the heat absorbing material 106 is known (e.g., in kilojoules per mole (kJ/mole)) then the number of moles M of heat absorbing material may be calculated from $M=qt/\Delta H_m$. The mass (e.g., in grams) of heat absorbing material 106 may be calculated from the molecular weight mw (e.g., in grams per mole) of the heat absorbing material 106 may be calculated using m=(mw)(M). Once the mass of heat absorbing material 106 is known, the thickness of the heat absorbing material may be calculated from the density and shape of the heat absorbing material. It is estimated that only about 5-10 grams of Ga or a thickness of about 20-25 micron as the heat absorbing material 106 is required to stabilize the temperature of the wafer 104 during its lithographic exposure cycle under the most aggressive set of processing conditions.

Figure 1D:
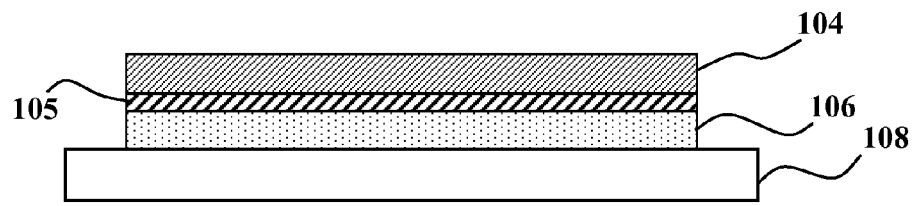
FIG. 1D is a cross-sectional schematic diagram of another alternative implementation of phase-transition driven temperature stabilization according to an embodiment of the present invention.

To facilitate thermal contact for heat transfer, it is often desirable for at least one of the substrate 104 and heat absorbing material 106 to be compliant enough to absorb interfacial incompliance with its counterpart. For many types of substrates, e.g., semiconductor wafers, the substrate provides very limited opportunities for adjustment of interfacial compliance. To provide a desired degree of interfacial compliance, an intermediate thin compliant and thermoconductive liner 105 may be introduced between the substrate 104 and the heat absorbing material 106, as shown in FIG. 1D. Examples of suitable materials that may be used as the liner 105 include fluoropolymer elastomers, such as Viton®, polyurethane, silicone rubbers, neoprene rubbers and the like. Viton® is a registered trademark of DuPont Performance Elastomers of Wilmington, Del.

Figure 1E:
FIG. 1E is a cross-sectional schematic diagram of a composite heat transfer layer according to an alternative embodiment of the invention.

Alternatively, a heat absorbing material 106 may be embedded in a suitable compliant material. For example FIG. 1E depicts an example of a composite heat absorbing layer 120 having a nano-composite of nano-particles 122 of heat absorbing material embedded in a suitable polymer material 124. By way of example, the nano-particles 122 may be nano-particles of gallium and the suitable polymer may be a fluoropolymer elastomer such as Viton®. Such a composite heat absorbing material may provide sufficient compliance for thermal conductivity between substrate and embedded heat transfer material. The Gallium/polymer ratio and durometer of the Gallium and polymer composite may be adjusted and optimized to provide both sufficient heat capacitance and shape compliance performance.

Embodiments of the invention allow for greatly simplified thermal management during substrate processing. Such simplified thermal management may make possible the widespread use of electron beam lithography for direct writing of integrated circuit features along an arbitrary path on semiconductor wafers and other forms of high volume substrate processing.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A temperature stabilization system, comprising:
a susceptor adapted to receive a semiconductor substrate; and
a heat absorbing material disposed between a surface of the susceptor and the substrate, the heat absorbing material being characterized by a solid-liquid or solid-solid phase transition temperature that is in a desired temperature range for processing the substrate, wherein the solid-liquid or solid-solid phase transition of the heat absorbing material stabilizes the temperature of the substrate during material processing of the substrate.

2. The temperature stabilization system of claim 1 wherein the solid-liquid phase transition temperature is about room temperature.

3. The temperature stabilization system of claim 1 wherein the heat absorbing material includes a metal selected from the group consisting of Ga, In, Sb, Hg, and Pb or a substance that melts without decomposition at constant temperature.

4. The temperature stabilization system of claim 3, wherein the heat absorbing material is a composite that further comprises a polymer.

5. The temperature stabilization system of claim 4 wherein the polymer is a fluoropolymer elastomer.

6. The temperature stabilization system of claim 4 wherein the heat absorbing material is embedded in the polymer.

7. The system of claim 6 wherein the heat absorbing material is in the form of nanoparticles embedded in the polymer.

8. The temperature stabilization system of claim 1 wherein the thickness of the heat absorbing material is derived from the amount of heat needed to be absorbed during a process cycle.

9. The temperature stabilization system of claim 1 wherein the heat absorbing material comprises an alloy of two or more metals from the group of Ga, In, Sb and Pb, or other substances that melt without decomposition at a constant temperature.

10. The system of claim 1 wherein the susceptor includes a wafer chuck.

11. The system of claim 1, further comprising a compliant and thermally conductive liner disposed between the heat absorbing material and the substrate, the compliant and thermally conductive liner being adapted to absorb mechanical incompliance between the substrate and the heat absorbing material and provide thermal contact between the substrate and the heat absorbing material.

12. The system of claim 1 wherein the susceptor includes one or more reservoirs adapted to receive the heat absorbing material.

13. A method for temperature stabilization of a substrate, comprising:

disposing a heat absorbing material in thermal contact with a substrate, the heat absorbing material being characterized by a solid-liquid or solid-solid phase transition temperature that is in a desired temperature range for processing the substrate;
subjecting the substrate to material processing that results in heat absorbing into or out of the substrate as a result of the material processing;
wherein the solid-liquid or solid-solid phase transition of the heat absorbing material stabilizes the temperature of the substrate during processing of the substrate.

14. The method of claim 13 wherein subjecting the substrate to processing includes processing the substrate with a semiconductor processing tool.

15. The method of claim 13 wherein subjecting the substrate to processing includes lithography, scanning electron microscopy, wafer inspection.

16. The method of claim 13 wherein subjecting the substrate to processing includes performing electron beam lithography on the substrate.

17. The method of claim 16 wherein performing electron beam lithography includes focusing a beam of electrons on a surface of the substrate, and moving the substrate relative to the electron beam, whereby the electron beam lithography is performed along a predetermined path on the substrate.

18. The method of claim 13, further comprising transferring heat to or from the heat absorbing material before disposing the heat absorbing material in thermal contact with the substrate.

19. The method of claim 18 wherein transferring heat to or from the heat absorbing material includes bringing the heat absorbing material into thermal contact with a heat sink.

20. A substrate processing system, comprising:
a susceptor adapted to receive one or more substrates;
a heat absorbing material disposed between the susceptor and one or more of the substrates, the heat absorbing material being characterized by a solid-liquid or solid-solid phase transition temperature that is in a desired temperature range for processing the substrate, wherein the solid-liquid or solid-solid phase transition of the heat absorbing material stabilizes the temperature of the substrate during processing of the substrate;
an electron beam source adapted to deliver a beam of electrons to a surface of one or more of the substrates; and
a mechanism adapted to translate and/or rotate the susceptor and/or the one or more substrates relative to the electron beam source with respect to one or more axes, whereby the motion of the susceptor facilitates processing of the substrates with the electron beam along a predetermined path.

21. A composition of matter comprising a polymer and nano-particles of Gallium embedded within the polymer.

* * * * *